United States Patent
Hamaguchi

(10) Patent No.: US 11,895,406 B2
(45) Date of Patent: Feb. 6, 2024

(54) IMAGING DEVICE ASSEMBLY, THREE-DIMENSIONAL SHAPE MEASURING DEVICE, AND MOTION DETECTING DEVICE

(71) Applicant: Sony Semiconductor Solutions Corporation, Kanagawa (JP)

(72) Inventor: Yuichi Hamaguchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 401 days.

(21) Appl. No.: 17/415,536

(22) PCT Filed: Jan. 10, 2020

(86) PCT No.: PCT/JP2020/000628
§ 371 (c)(1),
(2) Date: Jun. 17, 2021

(87) PCT Pub. No.: WO2020/149226
PCT Pub. Date: Jul. 23, 2020

(65) Prior Publication Data
US 2022/0046159 A1  Feb. 10, 2022

(30) Foreign Application Priority Data
Jan. 16, 2019 (JP) ................. 2019-004853

(51) Int. Cl.
*G06T 7/521* (2017.01)
*H04N 13/254* (2018.01)
(Continued)

(52) U.S. Cl.
CPC ............. *H04N 23/72* (2023.01); *G01B 11/22* (2013.01); *G01B 11/25* (2013.01); *G06T 7/246* (2017.01);
(Continued)

(58) Field of Classification Search
CPC ...... G06T 7/521; H04N 13/254; H04N 23/56; G01B 11/25
See application file for complete search history.

(56) References Cited

U.S. PATENT DOCUMENTS 6,339,213 B2 * 1/2002 Harada ................ H04N 25/625
348/E5.08
10,861,888 B2 * 12/2020 Na .................... H01L 27/14621
(Continued)

FOREIGN PATENT DOCUMENTS

| JP | 2002164529 A | 6/2002 |
|---|---|---|
| JP | 2013207321 A | 10/2013 |
| WO | WO2016/098400 A1 | 6/2016 |

OTHER PUBLICATIONS

International Search Report issued in International Patent Application No. PCT/JP2020/000628 dated Mar. 10, 2020 and English translation of same. 5 pages.
(Continued)

*Primary Examiner* — Jayanti K Patel
*Assistant Examiner* — Christopher Kingsbury Glover
(74) *Attorney, Agent, or Firm* — K&L Gates LLP

(57) ABSTRACT

An imaging device assembly includes a light source, an imaging device formed with a plurality of imaging elements, and a control device. Each imaging element (10) includes a light receiving portion (21), a first charge storage portion (22) and a second charge storage portion (24), and a first charge transfer control means (23) and a second charge transfer control means (24). Under the control of the control device, the imaging element (10) captures an image of an object on the basis of high-intensity light and stores first image signal charge into the first charge storage portion (22) during a first period, and captures an image of the object on the basis of low-intensity light and stores second image signal charge into the second charge storage portion (24)
(Continued)

during a second period. The control device obtains an image signal on the basis of the difference between the first image signal charge and the second image signal charge.

19 Claims, 10 Drawing Sheets

(51) Int. Cl.
*G01B 11/22* (2006.01)
*G01B 11/25* (2006.01)
*H04N 23/56* (2023.01)
*H04N 23/72* (2023.01)
*G06T 7/246* (2017.01)
*G06T 7/73* (2017.01)
*G06T 7/593* (2017.01)

(52) U.S. Cl.
CPC .............. *G06T 7/521* (2017.01); *G06T 7/593* (2017.01); *G06T 7/73* (2017.01); *H04N 13/254* (2018.05); *H04N 23/56* (2023.01); *G06T 2207/10012* (2013.01); *G06T 2207/10028* (2013.01); *G06T 2207/10152* (2013.01); *G06T 2207/20212* (2013.01)

(56) References Cited

U.S. PATENT DOCUMENTS

2017/0343338 A1\* 11/2017 Hamaguchi ............. G06T 7/254
2021/0270940 A1\* 9/2021 Watanabe ............. G01S 7/4816

OTHER PUBLICATIONS

Written Opinion issued in International Patent Application No. PCT/JP2020/000628 dated Mar. 10, 2020. 3 pages.

\* cited by examiner

IMAGING DEVICE ASSEMBLY, THREE-DIMENSIONAL SHAPE MEASURING DEVICE, AND MOTION DETECTING DEVICE

TECHNICAL FIELD

The present disclosure relates to an imaging device assembly, a three-dimensional shape measuring device, and a motion detecting device.

BACKGROUND ART

Known methods for measuring the distance to an object and measuring the three-dimensional shape of the object in a non-contact manner include: a stereo method by which two imaging devices are disposed in parallel, and measurement is performed by the principle of triangulation; and a structured light method by which one light source and one imaging device are disposed in parallel, and measurement is then performed (see WO 2016/098400 A1, for example). Specifically, by the structured light method, a reference light pattern based on infrared rays is emitted from the light source formed with a laser device, for example, and the reference light pattern is emitted onto the object. Examples of the reference light pattern include a line-and-space pattern, a grid pattern, and a dot pattern. The object illuminated with the reference light pattern is then imaged by the imaging device. Here, as shown in a conceptual diagram in FIG. 9A, coordinates (x, y) are expressed by Equations (A) shown below, where L represents the distance (the length of the base line) between the light source and the imaging device, $\alpha$ represents the angle formed by the base line and the emitted light (a light beam) illuminating the object, $\beta$ represents the angle formed by the base line and the straight line connecting the portion of the object with which the emitted light collides to the imaging device, the light source is disposed at the origin (0,0) of the coordinate system, and (x, y) are the coordinates of the portion of the object at which the light beam collides.

Further, the stereo method is a method by which two imaging devices are used, and the light source in the structured light method is replaced with one of the two imaging devices. However, as shown in a conceptual diagram in FIG. 9B, a light source may be provided separately in some other method (an active stereo method).

$$x = L \cdot \tan(\beta) / \{\tan(\alpha) + \tan(\beta)\}$$

$$y = L \cdot \tan(\beta) \cdot \tan(\alpha) / \{\tan(\alpha) + \tan(\beta)\} \quad (A)$$

CITATION LIST

Patent Document

Patent Document 1: WO 2016/098400 A1

SUMMARY OF THE INVENTION

Problems to be Solved by the Invention

Meanwhile, by the structured light method and the active stereo method, an imaging device needs to obtain the reference light pattern illuminating the object as image data. Therefore, due to the influence of ambient light (sunlight, indoor lighting, or the like), it is often difficult to obtain image data of the reference light pattern illuminating the object. Increasing the sensitivity of the imaging device(s) does not provide a drastic solution, because the sensitivity of the imaging device(s) to ambient light also increases. It might be possible to adopt a method that uses a filter to remove, from ambient light, the light having the same wavelength as the wavelength of the light to be emitted from the light source. However, there is a limit to the bandwidth of a filter, and therefore, it is difficult to remove such light from ambient light with high efficiency. Increasing the luminance of the light source will lead to an increase in the power consumption at the light source, or in some cases, will even lead to visual recognition of the reference light pattern.

Therefore, the present disclosure aims to provide an imaging device assembly capable of reliably obtaining image data without being affected by ambient light despite its simple structure and configuration, and a three-dimensional shape measuring device and a motion detecting device that use the imaging device assembly.

Solutions to Problems

An imaging device assembly of the present disclosure for achieving the above objective includes:
  a light source that illuminates an object;
  an imaging device; and
  a control device that controls the light source and the imaging device.

The imaging device includes a plurality of imaging elements, and
  each imaging element includes:
    a light receiving portion;
    a first charge storage portion and a second charge storage portion; and
    a first charge transfer control means that controls, under the control of the control device, transfer of the electric charge stored in the light receiving portion to the first charge storage portion, and a second charge transfer control means that controls, under the control of the control device, transfer of the electric charge stored in the light receiving portion to the second charge storage portion.

The imaging device assembly is operated in a first operation mode.

Here, in the first operation mode,
  under the control of the control device, the imaging element captures an image of the object on the basis of high-intensity light emitted from the light source and stores first image signal charge obtained at the light receiving portion into the first charge storage portion during a first period $TP_1$, and captures an image of the object on the basis of low-intensity light and stores second image signal charge obtained at the light receiving portion into the second charge storage portion during a second period $TP_2$, and the control device obtains (generates) an image signal, on the basis of the difference between the first image signal charge stored in the first charge storage portion and the second image signal charge stored in the second charge storage portion.

A three-dimensional shape measuring device of the present disclosure for achieving the above objective includes the imaging device assembly of the present disclosure.

A motion detecting device of the present disclosure for achieving the above objective includes the imaging device assembly of the present disclosure.

MODES FOR CARRYING OUT THE INVENTION

Figure 1A:
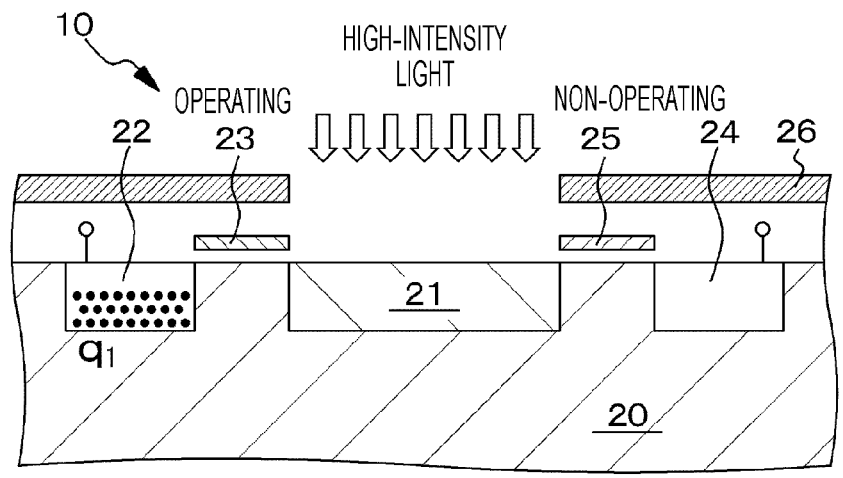
FIGS. 1A and 1B are conceptual diagrams for explaining operation of an imaging element of an imaging device assembly of a first embodiment.

The following is a description of the present disclosure based on embodiments, with reference to the drawings. However, the present disclosure is not limited to the embodiments, and the various numerical values and materials mentioned in the embodiments are merely examples. Note that explanation will be made in the following order.
1. General description of an imaging device assembly of the present disclosure, a three-dimensional shape measuring device of the present disclosure, and a motion detecting device of the present disclosure
2. First embodiment (an imaging device assembly of the present disclosure, a three-dimensional shape measuring device of the present disclosure, and the motion detecting device of the present disclosure).
3. Second embodiment (a modification of the first embodiment)
4. Third embodiment (modifications of the first and second embodiments)
5. Fourth embodiment (modifications of the first to third embodiments)
6. Other aspects <General Description of an Imaging Device Assembly of the Present Disclosure, a Three-Dimensional Shape Measuring Device of the Present Disclosure, and a Motion Detecting Device of the Present Disclosure>

An imaging device assembly of the present disclosure, or an imaging device assembly of the present disclosure included in a three-dimensional shape measuring device of the present disclosure and a motion detecting device of the present disclosure are collectively referred to as "the imaging device assembly and the like of the present disclosure" in some cases. During a second period $TP_2$, an object is imaged on the basis of low-intensity light, but it includes a mode in which the object is imaged on the basis of low-intensity light emitted from a light source, and a mode in which the object is imaged not on the basis of light emitted from the light source but on the basis of external light (ambient light) while the light source is in a non-operating state. A state in which the object is imaged on the basis of high-intensity light emitted from the light source during a first period $TP_1$ is called a "high-intensity light illuminated state", for convenience. A state in which the object is imaged on the basis of low-intensity light during the second period $TP_2$ is called a "low-intensity light illuminated state", for convenience.

In the imaging device assembly and the like of the present disclosure,
the high-intensity light emitted from the light source is a reference light pattern, and,
on the basis of the obtained image signal, the control device can calculate the distance to the object, the external shape of the object, or the distance to the object and the external shape of the object. Further, in this case, from the obtained image signal and on the basis of triangulation (specifically, a structured light method or an active stereo method), the control device can calculate the distance to the object, or calculates the external shape of the object, or calculates the distance to the object and the external shape of the object. Note that, in the low-intensity light illuminated state, the light source may not be emitting the reference light pattern, or may be emitting the reference light pattern.

The luminance of the reference light pattern to be emitted from the light source (the amount of light to be emitted by the light source) is only required to be determined by various tests, as appropriate. Alternatively, the user may perform switching between an outdoor mode and an indoor mode, for example, to switch or change the luminance of the reference light pattern to be emitted from the light source (the amount of light to be emitted by the light source). Note that, even if the light source is in an operating state (which is a state in which the reference light pattern is being emitted) in the low-intensity light illuminated state, it is possible to remove the influence of ambient light from the image signal by calculating the difference between the first image signal charge and the second image signal charge, as long as the high-intensity light illuminated state or the low-intensity light illuminated state is appropriately selected.

The imaging device assembly and the like of the present disclosure including various preferred modes described above can be further operated in a second operation mode. Here, in the second operation mode,
under the control of the control device, the imaging element captures an image of the object on the basis of light emitted from the light source during a fifth period $TP_5$ overlapping a third period $TP_3$ and a fourth period $TP_4$, stores third image signal charge obtained at the light receiving portion into the first charge storage portion during the third period $TP_3$, and stores fourth image signal charge obtained at the light receiving portion into the second charge storage portion during the fourth period $TP_4$, and
the control device calculates the distance from the imaging device to the object, on the basis of the third image signal charge stored in the first charge storage portion and the fourth image signal charge stored in the second charge storage portion. Further, in this case, the distance D from the imaging device to the object can be calculated on the basis of the following equation:

$$D=(c \cdot T_P/2) \times Q_4/(Q_3+Q_4)$$

where $Q_3$ represents the third image signal charge, $Q_4$ represents the fourth image signal charge, c represents the speed of light, and $T_P$ represents the time of the third period $TP_3$ and the fourth period $TP_4$. Note that, these preferable configurations are referred to as "the imaging device assembly and the like of the present disclosure provided with the second operation mode", for convenience. Such a second operation mode is also called an indirect TOF (Time Of Flight) method. That is, in the second operation mode, the time since light comes into contact with the object and is reflected by the object till the light enters the imaging device is replaced with the exposure amount of the imaging device, and distance measurement is then performed.

In the imaging device assembly and the like of the present disclosure provided with the second operation mode, the control device can perform switching from the first operation mode to the second operation mode, and switching from the second operation mode to the first operation mode. For example, switching from the first operation mode to the second operation mode, and switching from the second operation mode to the first operation mode may be performed, on the basis of an instruction from the user. Further, in this case, or in the imaging device assembly and the like of the present disclosure provided with the second operation mode, the control device can create a first depth map on the basis of the first operation mode, create a second depth map on the basis of the second operation mode, and combines the first depth map and the second depth map. By doing so, the control device can increase the depth map (depth information) accuracy. In general, distance measurement based on the first operation mode is suitable for measurement of a short distance (shorter than 1 m, for example), and distance measurement based on the second operation mode is suitable for measurement of a long distance (1 m or longer, for example). Therefore, for example, in a region with a measured distance shorter than 1 m, the first depth map can be created on the basis of the first operation mode. In a region with a measured distance of 1 m or longer, the second depth map can be created on the basis of the second operation mode.

Alternatively, in the imaging device assembly and the like of the present disclosure provided with the second operation mode, the control device can enable the first operation mode in a desired region of the imaging device, and enable the second operation mode in another desired region of the imaging device. Examples of such a configuration include an example in which the second operation mode is applied to a region in which pattern recognition is not possible due to insufficient luminance of the object (pattern) in the first operation mode (that is, a region in which it is not possible to acquire distance information in the first operation mode).

Alternatively, in the imaging device assembly and the like of the present disclosure provided with the second operation mode, the control device can calibrate the distance to the object calculated on the basis of the second operation mode, on the basis of the distance to the object calculated on the basis of the first operation mode. For example, the user may switch calibration modes. Specifically, when a calibration mode button is pressed, distance information is acquired in the first operation mode with the number of frames determined after activation of the imaging device. After that, the distance information is promptly acquired in the second operation mode, and matching (calibration) is performed between the acquired distance information in the first operation mode and the distance information in the second operation mode. Alternatively, it is also possible to adopt a configuration in which the distance is measured in the first operation mode for several frames each time after the imaging device is activated, and distance correction in the second operation mode is performed each time after the imaging device is activated.

Alternatively, in the imaging device assembly and the like of the present disclosure provided with the second operation mode, the control device can calibrate the distance to the object calculated on the basis of the first operation mode, on the basis of the distance to the object calculated on the basis of the second operation mode. For example, the user may switch calibration modes, as in the case described above.

Alternatively, in the imaging device assembly and the like of the present disclosure provided with the second operation mode, when a discontinuous state is found in the distance to the object calculated on the basis of the second operation mode, or when the distance to the object calculated on the basis of the second operation mode has an inconstant value, the control device can switch to the first operation mode and calculate the distance to the object. Alternatively, in a case where the distance D from the imaging device to the object varies despite the fact that the distance D from the imaging device to the object should be invariable when the time length $T_3$ of the third period $TP_3$ and the time length $T_4$ of the fourth period $TP_4$ are changed while the value of (time length $T_3$ of the third period $TP_3$)/(time length $T_4$ of the fourth period $TP_4$) is made constant, the control device can switch to the first operation mode and calculate the distance to the object.

Alternatively, in the imaging device assembly and the like of the present disclosure provided with the second operation mode, when the distance to the object calculated on the basis of the second operation mode is shorter than a predetermined value, the control device can switch to the first operation mode and calculate the distance to the object. That is, when the calculated distance to the object is shorter than the predetermined value during an operation in the second operation mode, the control device can switch to the first operation mode and calculate the distance to the object. The predetermined value may be 1 m, for example, but is not limited to such a value. The same applies in the following description. Switching from the second operation mode to the first operation mode may be performed by the control device.

Alternatively, in the imaging device assembly and the like of the present disclosure provided with the second operation mode, when the distance to the object calculated on the basis of the first operation mode is equal to or longer than the predetermined value, the control device can switch to the second operation mode and calculate the distance to the object. That is, when the calculated distance to the object is equal to or longer than the predetermined value during an operation in the first operation mode, the control device can switch to the second operation mode and calculate the distance to the object. Switching from the first operation mode to the second operation mode may be performed by the control device.

Further, the imaging device assembly and the like of the present disclosure including the various preferred modes and configurations described above can include one imaging device, and the imaging device can be formed with an active stereo imaging device. In the imaging device assembly and the like of the present disclosure, in the mode in which one imaging device is provided, the distance from the imaging device to the object, the two-dimensional and three-dimensional shapes of the object, motion of the object, and the like can be calculated on the basis of the structured light method mentioned above. Alternatively, in a mode in which two imaging devices are provided, the distance from the imaging devices to the object, the two-dimensional and three-dimensional shapes of the object, motion of the object, and the like can be calculated on the basis of an active stereo method.

In the three-dimensional shape measuring device of the present disclosure including the imaging device assembly of the present disclosure including the various preferred modes and configurations described above,
    an arithmetic device is further provided, and
    the arithmetic device can calculate the three-dimensional shape of the object from an image signal.

In the motion detecting device of the present disclosure including the imaging device assembly of the present disclosure including the various preferred modes and configurations described above,
    an arithmetic device is further provided, and
    the arithmetic device calculates the three-dimensional shape of the object from an image signal, extracts a feature point of the object from the calculated three-dimensional shape, calculates the position of the feature point of the object, and detects motion of the object from a change in the calculated position of the feature point.

In the imaging device assembly and the like of the present disclosure including the preferred modes and configurations described above, when $T_1$ represents the time length (imaging time) of the first period $TP_1$, and $T_2$ represents the time length (imaging time) of the second period $TP_2$, the following can be satisfied:

$$T_1 > T_2$$

With this arrangement, it is possible to reduce the amount of high-intensity light to be emitted from the light source. However, the relationship is not limited to this, and can be expressed as follows, for example.

$T_1/T_2 = 1$ The imaging times $T_1$ and $T_2$ can be determined on the basis of the specifications and the like of the imaging device. Also, the imaging times $T_1$ and $T_2$ can be made variable, or the ratio of $T_1/T_2$ can be made variable, on the basis of an instruction from the user of the imaging device assembly.

Alternatively, in the imaging device assembly and the like of the present disclosure including the preferred modes and configurations described above,
    one imaging frame can be divided into a plurality of periods,
    one of the periods can be in a low-intensity light illuminated state, and
    the remaining periods can be in a high-intensity light illuminated state. Further, in this case,
    the imaging frame rate may be, but is not limited to, 30 frames/sec, and
    one imaging frame may be, but is not necessarily, divided into two or more periods (two to four periods, for example).

Note that, in this specification, "one imaging frame" means one imaging frame for generating an image signal from the difference between the first image signal charge and the second image signal charge. It does not mean the number of pieces of images per second to obtain a moving image.

Alternatively, in the imaging device assembly and the like of the present disclosure including the preferred modes and configurations described above, an imaging period during which the object is imaged in a high-intensity light illuminated state, and an imaging period during which the object is imaged in a low-intensity light illuminated state can be repeated, and the former imaging period (the first period $TP_1$) can be longer than the latter imaging period (the second period $TP_2$).

Further, in the imaging device assembly and the like of the present disclosure including the various preferred modes and configurations described above,
    the imaging device can include imaging elements arranged in a two-dimensional matrix in a first direction and a second direction, and
    the imaging device can have a rolling shutter mechanism, or can have a global shutter mechanism. Also, the control device can control the light source and the imaging device so that all the imaging elements capture an image the object and obtain the first image signal charge in a high-intensity light illuminated state, and all the imaging elements capture an image of the object and obtain the second image signal charge in a low-intensity light illuminated state.

In the imaging device assembly and the like of the present disclosure including the various preferred modes and configurations described above, the light source is preferably a light source that emits infrared rays having a wavelength of 780 nm to 980 nm, for example, but is not limited to this. The light source can be formed with a semiconductor laser element, or a semiconductor light-emitting element such as a light-emitting diode (LED) or a super luminescent diode (SLD), for example. The light source may be continuously driven or pulse-driven during emission, depending on the form of the light-emitting element forming the light source. The duty ratio in the case of pulse driving is only required to be determined as appropriate.

Examples of the reference light pattern include a line-and-space pattern, a grid pattern, and a dot pattern, but the reference light pattern is not limited to these, and can be any desired pattern. To obtain a line-and-space pattern, a grid pattern, or a dot pattern, a diffraction grating or the like is only required to be disposed on the light emitting side of the light source, or a pattern can be generated with a MEMS mirror, for example. Alternatively, a density gradation pattern, a checkered pattern, a conical pattern, or the like can also be adopted.

In the imaging device assembly and the like of the present disclosure, the imaging device can be a known imaging device including imaging elements (image sensors) such as charge coupled device (CCD) imaging elements, complementary metal oxide semiconductor (CMOS) imaging elements, charge modulation device (CMD) signal amplifier imaging elements, or contact image sensors (CISs), for example. The imaging device can have a known configuration and structure. Also, the imaging device can be a front-illuminated solid-state imaging device or a back-illuminated solid-state imaging device, or can be formed with a digital still camera, a video camera, or a camcorder, for example. The imaging device may include imaging elements that can convert light having the above wavelength into a signal (specifically, imaging elements that receive infrared rays, for example). Alternatively, the imaging device preferably includes not only imaging elements suitable for capturing an image of the reference light pattern, but also imaging elements suitable for capturing an image of the object, for example, and such imaging elements can be a combination of an imaging element that detects infrared rays, an imaging element that receives (detects) red light, an imaging element that receives (detects) green light, and an imaging element that receives (detects) blue light, for example. To measure the three-dimensional shape or detect motion of the object illuminated with the reference light pattern, for example, imaging should be possible at least with the wavelength of the reference light pattern (infrared rays, for example). However, as the imaging elements include an imaging element that receives red light, an imaging element that receives green light, an imaging element that receives blue light, and the like, in addition to an imaging element that receives infrared rays, measurement and detection accuracy can be further increased, and imaging (photographing) of the object can be performed at the same time as three-dimensional shape measurement and motion detection.

The imaging device may include a filter that passes light having the same wavelength as the wavelength of the light to be emitted from the light source. In a case where the object is illuminated with light of a predetermined wavelength (a wavelength of about 850 nm, for example), and the three-dimensional shape and motion of the illuminated object are measured and detected, the imaging device should be able to image at least a predetermined wavelength component. Therefore, a filter for wavelength selection having desired characteristics, such as a bandpass filter that passes only light having a wavelength near 850 nm, for example, may be disposed on the light incident side of the imaging device. With this arrangement, the influence of wavelength components other than 850 nm in ambient light can be eliminated as much as possible, and an imaging device assembly, a three-dimensional shape measuring device, and a motion detecting device that are less affected by ambient light can be provided. Note that the characteristics of the filter for wavelength selection are not limited to those of a bandpass filter, and may be determined as appropriate in accordance with the wavelength profile of ambient light and the frequency characteristics of the imaging device.

The object may be any desired object. The imaging device assembly and the like of the present disclosure can be used outdoors or indoors. The imaging device assembly and the like of the present disclosure can be used in a motion sensor, a surveillance camera system, a depth sensor, a three-dimensional shape sensor, a two-dimensional shape sensor, a three-dimensional position sensor, a two-dimensional position sensor, a distance sensor, a range sensor, a vehicle collision prevention sensor, or a quality control and quality inspection system, for example.

An imaging method in the present disclosure is substantially an imaging method using the imaging device assembly of the present disclosure, and includes:

capturing an image of the object on the basis of high-intensity light emitted from the light source and storing the first image signal charge obtained at the light receiving portion into the first charge storage portion during the first period $TP_1$, and capturing an image of the object on the basis of low-intensity light and storing the second image signal charge obtained at the light receiving portion into the second charge storage portion during the second period $TP_2$; and obtaining (generating) an image signal, on the basis of the difference between the first image signal charge stored in the first charge storage portion and the second image signal charge stored in the second charge storage portion.

A three-dimensional shape measuring method in the present disclosure is substantially a three-dimensional shape measuring method using the imaging device assembly of the present disclosure, and includes:

capturing an image of the object on the basis of high-intensity light emitted from the light source and storing the first image signal charge obtained at the light receiving portion into the first charge storage portion during the first period $TP_1$, and capturing an image of the object on the basis of low-intensity light and storing the second image signal charge obtained at the light receiving portion into the second charge storage portion during the second period $TP_2$; and calculating a three-dimensional shape from an image signal, after obtaining (generating) the image signal on the basis of the difference between the first image signal charge stored in the first charge storage portion and the second image signal charge stored in the second charge storage portion.

Further, a motion detecting method in the present disclosure is substantially a motion detecting method using the imaging device assembly of the present disclosure, and includes:

capturing an image of the object on the basis of high-intensity light emitted from the light source and storing the first image signal charge obtained at the light receiving portion into the first charge storage portion during the first period $TP_1$, and capturing an image of the object on the basis of low-intensity light and storing the second image signal charge obtained at the light receiving portion into the second charge storage portion during the second period $TP_2$;

sequentially performing operations of calculating a three-dimensional shape from an image signal after obtaining (generating) the image signal on the basis of the difference between the first image signal charge stored in the first charge storage portion and the second image signal charge stored in the second charge storage portion; and sequentially extracting feature points of the object from the calculated three-dimensional shapes, sequentially calculating the positions of the extracted feature points of the object, and detecting motion of the object from changes in the calculated positions of the feature points.

First Embodiment

A first embodiment relates to an imaging device assembly of the present disclosure, a three-dimensional shape measuring device of the present disclosure, and a motion detecting device of the present disclosure.

Figure 1B:
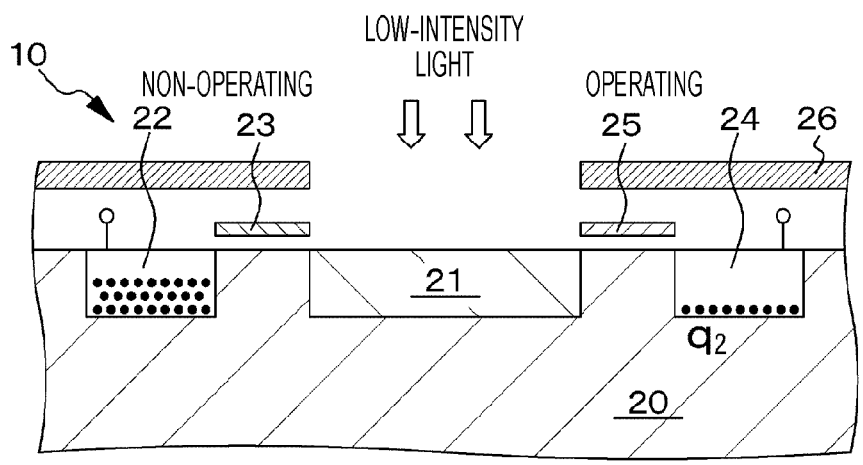
Figure 2A:
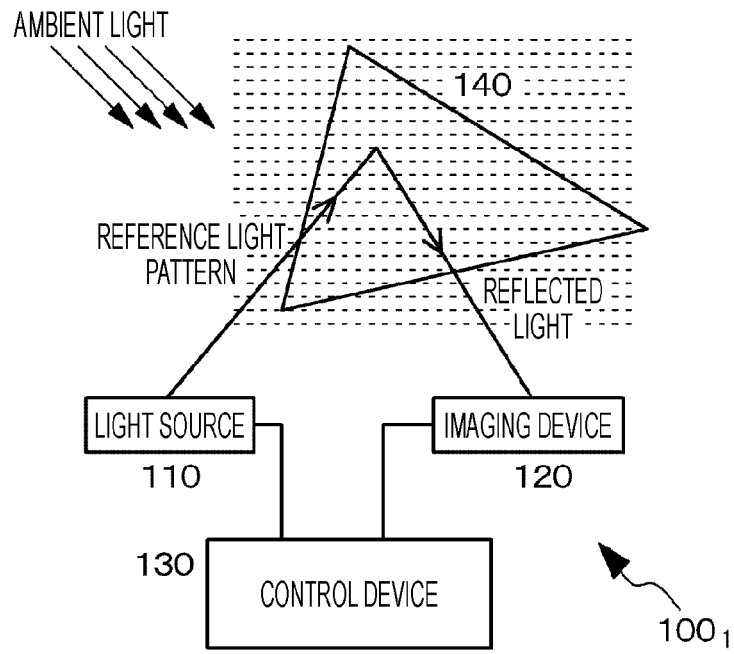
FIG. 2A is a conceptual diagram of the imaging device assembly of the first embodiment.

An imaging device assembly $100_1$ of the first embodiment shown in a conceptual diagram in FIG. 2A includes a light source 110 that illuminates an object 140, an imaging device 120, and a control device 130 that controls the light source 110 and the imaging device 120. The imaging device 120 is formed with a plurality of imaging elements 10. Further, as shown in FIGS. 1A and 1B, each imaging element 10 includes: a light receiving portion 21; a first charge storage portion 22 and a second charge storage portion 24; a first charge transfer control means 23 that controls transfer of the electric charge stored in the light receiving portion 21 (or the electric charge generated at the light receiving portion 21) to the first charge storage portion 22, under the control of the control device 130; and a second charge transfer control means 25 that controls transfer of the electric charge stored in the light receiving portion 21 (or the electric charge generated at the light receiving portion 21) to the second charge storage portion 24, under the control of the control device 130. Each imaging element 10 is operated in a first operation mode. Note that such an imaging element 10 is also called a current assisted photonic demodulator (CAPD)-type imaging element or a gate-transfer imaging element. The region other than the light receiving portion 21 is covered with a light blocking layer 26. The first charge transfer control means 23 and the second charge transfer control means 25 have the same configuration and structure as a gate electrode.

Figure 3A:
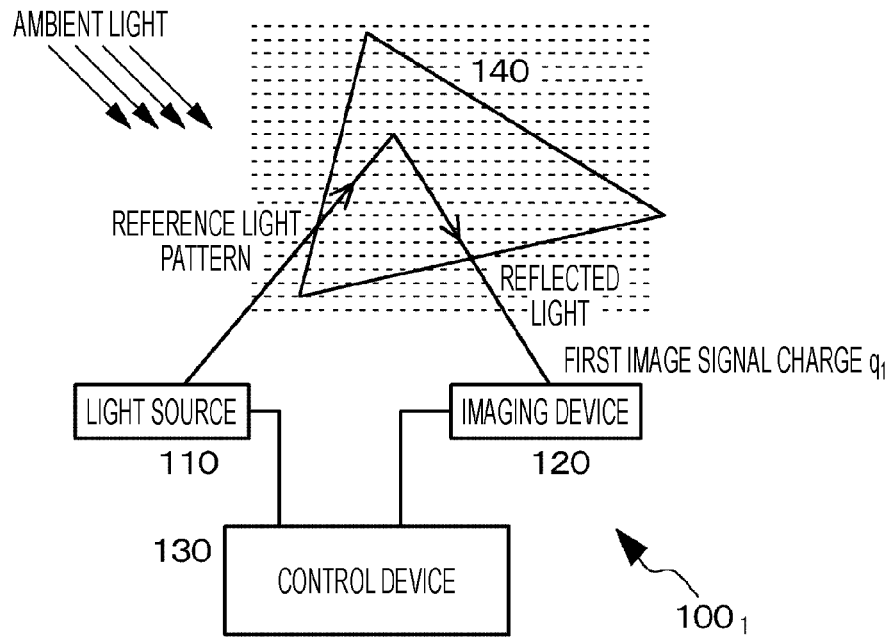
FIGS. 3A and 3B are diagrams schematically showing a state in which first image signal charge is acquired and a state in which second image signal charge is acquired in an imaging device assembly of the first embodiment, respectively.
Figure 3B:
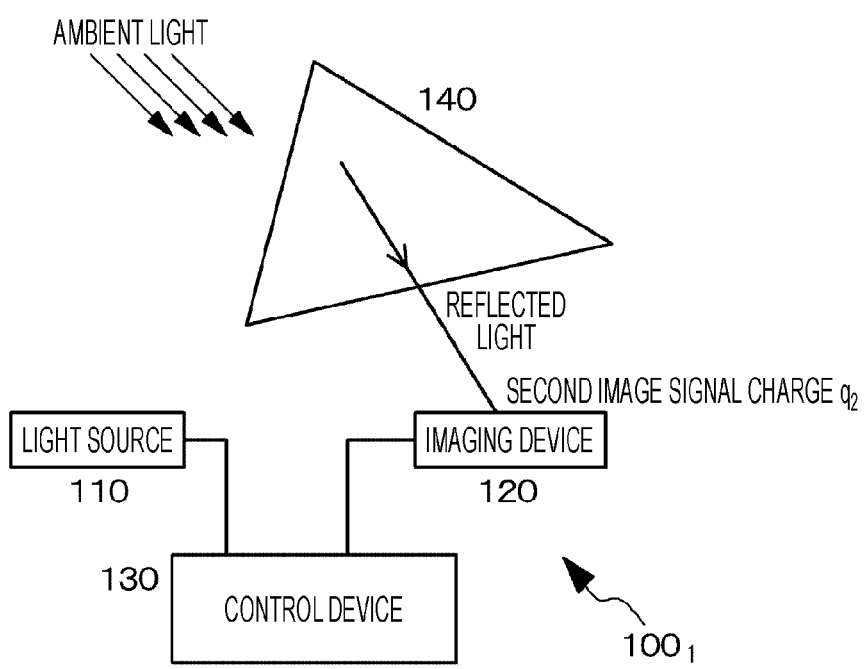

Here, in the first operation mode,
under the control of the control device 130, the imaging element 10 captures an image the object 140 (see FIG. 3A) on the basis of high-intensity light emitted from the light source 110 and stores first image signal charge $q_1$ obtained at the light receiving portion 21 into the first charge storage portion 22 during a first period $TP_1$ (an imaging time, with a time length $T_1$), and captures an image of the object 140 (see FIG. 3B) on the basis of low-intensity light, or specifically, in a state in which no light is being emitted from the light source 110, for example, and stores second image signal charge $q_2$ obtained at the light receiving portion 21 into the second charge storage portion 24 during a second period $TP_2$ (an imaging time, with a time length $T_2$), and
the control device 130 obtains (generates) an image signal, on the basis of the difference between the first image signal charge $q_1$ stored in the first charge storage portion 22 and the second image signal charge $q_2$ stored in the second charge storage portion 24.

Figure 6A:
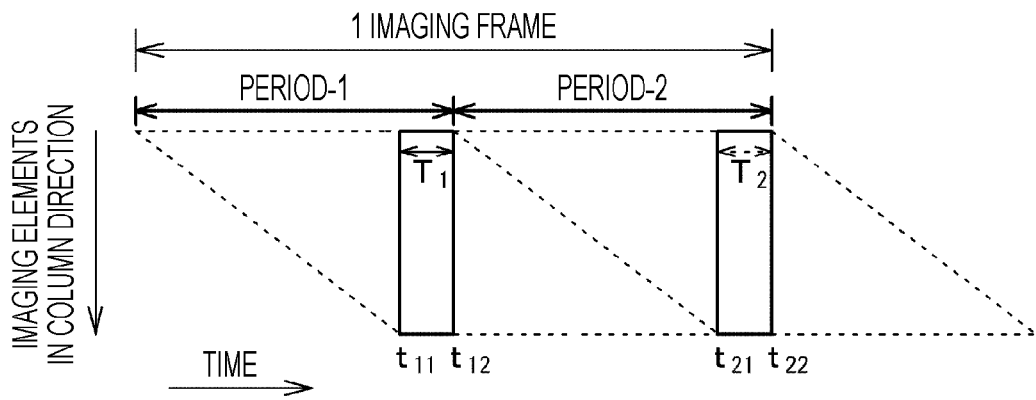
FIGS. 6A, 6B, and 6C are diagrams schematically showing imaging times $T_1$ and $T_2$ per imaging frame.
Figure 6B:
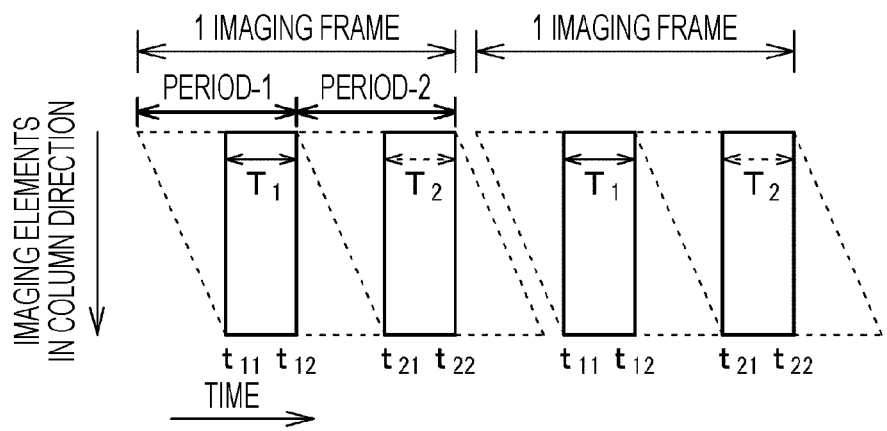
Figure 6C:
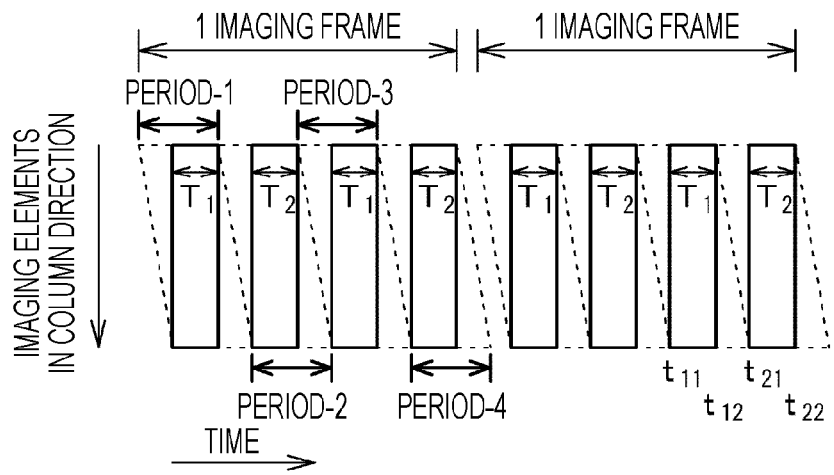

In the first embodiment, $T_1=T_2$. The imaging times $T_1$ and $T_2$ per imaging frame are schematically shown in FIGS. 6A, 6B, and 6C, and these charts are charts in a case where a rolling shutter mechanism is adopted as the shutter mechanism. Note that, in FIGS. 6A, 6B, and 6C, and FIGS. 7A, 7B, 8A, and 8B, which will be described later, solid-line rectangles represent high-intensity light illuminated states during the first period $TP_1$ and low-intensity light illuminated states during the second period $TP_2$. In each of FIGS. 6A, 6B, 6C, 7A, 7B, 8A, and 8B, a high-intensity light illuminated state is maintained during the imaging time $T_1$ from time $t_{11}$ to time $t_{12}$, and a low-intensity light illuminated state is maintained during the imaging time $T_2$ from time $t_{21}$ to time $t_{22}$.

The light that illuminates the object 140 in a high-intensity light illuminated state includes light from the light source 110 and external light (ambient light). That is, in a high-intensity light illuminated state, the light source 110 is in an operating state, and emits a reference light pattern. Meanwhile, the light that illuminates the object 140 in a low-intensity light illuminated state includes external light (ambient light), but also includes light from the light source in some cases. Specifically, in first to fourth embodiments, in a low-intensity light illuminated state, for example, the light source 110 is in a non-operating state (which is a state in which the reference light pattern is not being emitted).

In the first embodiment, high-intensity light emitted from the light source 110 is the reference light pattern (indicated by a plurality of dotted lines extending in the horizontal direction in the drawings). On the basis of the obtained image signal, the control device 130 then calculates the distance to the object 140, or calculates the external shape of the object 140, or calculates the distance to the object 140 and the external shape of the object 140. Specifically, from the obtained image signal and on the basis of triangulation (specifically, the structured light method or the active stereo method), the control device 130 calculates the distance to the object 140, or calculates the external shape of the object 140, or calculates the distance to the object 140 and the external shape of the object 140.

The three-dimensional shape measuring device and the motion detecting device of the first embodiment include the imaging device assembly of the first embodiment. Here, the three-dimensional shape measuring device of the present disclosure further includes an arithmetic device, and the arithmetic device calculates the three-dimensional shape of the object 140 from an image signal. Also, the motion detecting device of the first embodiment further includes an arithmetic device. The arithmetic device calculates the three-dimensional shape of the object 140 from an image signal, extracts a feature point of the object 140 from the calculated three-dimensional shape, calculates the position of the feature point of the object 140, and detects motion of the object 140 from a change in the calculated position of the feature point.

Light sources 110 and 210 are light sources that emit infrared rays having a wavelength of 850 nm, for example, and are formed with semiconductor laser elements. A line-and-space pattern is used as the reference light pattern, but the reference light pattern is not limited to this. To obtain a line-and-space pattern, a diffraction grating (not shown) is disposed on the light emitting side of the light sources 110 and 210, as needed. The imaging device 120 is formed with a known video camera or a camcorder in which CMOS imaging elements (CMOS image sensors) are arranged in a two-dimensional matrix, M imaging elements being aligned in a first direction (the row direction), N imaging elements being aligned in a second direction (the column direction). Further, the imaging device 120 is formed with combinations of imaging elements that receive (detect) red light, imaging elements that receive (detect) green light, imaging elements that receive (detect) blue light, and imaging elements that detect infrared rays. However, the imaging device 120 is not limited to this, and may be formed only with imaging elements that detect infrared rays.

The imaging device assembly $100_1$ of the first embodiment includes one imaging device 120. The shutter mechanism in the imaging device 120 may be either a global shutter mechanism or a rolling shutter mechanism. The imaging device 120 includes imaging elements arranged in a two-dimensional matrix in the first direction and the second direction. Specifically, the imaging device 120 has a rolling shutter mechanism, and the control device 130 has all the imaging elements capture an image of the reference light pattern and the object 140 in a high-intensity light illuminated state, and all the imaging elements capture an image of at least the object 140 in a low-intensity light illuminated state.

In the description below, an outline of an imaging method using the imaging device assembly of the first embodiment is described. Note that, in this imaging method, the distance from the imaging device to the object 140, the two-dimensional and three-dimensional shapes of the object 140, motion of the object 140, the distance to the object 140, and the like are calculated on the basis of the structured light method, for example. Also, in the three-dimensional shape measuring device of the present disclosure of the first embodiment, the three-dimensional shape of the object 140 is measured on the basis of a known processing algorithm, from image data based on an image signal obtained by the imaging method using the imaging device assembly of the first embodiment. In the motion detecting device of the first embodiment, motion of the object 140 is detected on the basis of a known processing algorithm, from image data based on an image signal obtained by the imaging method using the imaging device assembly of the first embodiment.

That is, the imaging method of the first embodiment, a three-dimensional shape measuring method of the first embodiment, or a motion detecting method of the first embodiment is an imaging method, a three-dimensional shape measuring method, or a motion detecting method using the imaging device assembly of the first embodiment.

During the first period $TP_1$, the object 140 is imaged on the basis of high-intensity light emitted from the light source 110, and the first image signal charge $q_1$ obtained at the light receiving portion 21 is stored into the first charge storage portion 22. During the second period $TP_2$, the object 140 is imaged on the basis of low-intensity light, and the second image signal charge $q_2$ obtained at the light receiving portion 21 is stored into the second charge storage portion 24.

An image signal is obtained (generated) on the basis of the difference between the first image signal charge $q_1$ stored in the first charge storage portion 22 and the second image signal charge $q_2$ stored in the second charge storage portion 24.

Further, in the three-dimensional shape measuring method of the first embodiment, the three-dimensional shape is calculated from the obtained image signal. Also, in the motion detecting method of the first embodiment, operations of calculating the three-dimensional shape from an image signal are sequentially performed, the feature points of the object 140 are sequentially extracted from the calculated three-dimensional shapes, the positions of the feature points of the object 140 are sequentially calculated, and motion of the object 140 is detected from changes in the calculated positions of the feature points.

Figure 1C:
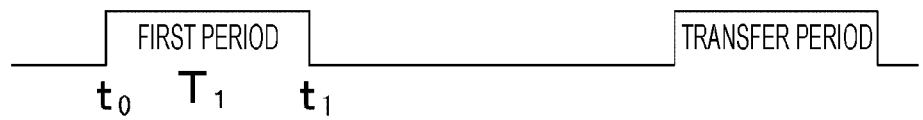
FIG. 1C is a diagram for explaining a temporal operation in a first operation mode of an imaging element of the imaging device assembly of the first embodiment.
Figure 1C:
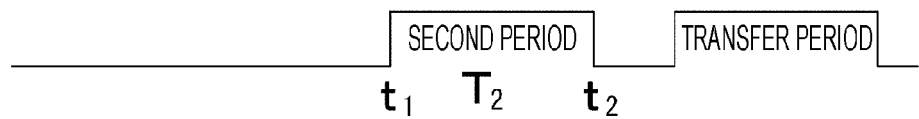

Specifically, the imaging device 120 captures an image of the reference light pattern and the object 140 in a high-intensity light illuminated state, to obtain the first image signal charge $q_1$. The imaging device 120 captures an image of at least the object 140 in a low-intensity light illuminated state (or captures an image of the object 140 in a low-intensity light illuminated state in the first embodiment), to obtain the second image signal charge $q_2$. That is, as shown in FIGS. 1A and 1C, under the control of the control device 130, each imaging element 10 captures an image of the object 140 on the basis of high-intensity light emitted from the light source 110 during the first period $TP_1$ (the time length $T_1$, time $t_0$ to time $t_1$ (see FIG. 3A), and stores the first image signal charge $q_1$ obtained at the light receiving portion 21 into the first charge storage portion 22. At this stage, the first charge transfer control means 23 is in an operating state (an on-state), and the second charge transfer control means 25 is in a non-operating state (an off-state). Next, as shown in FIGS. 1B and 1D, during the second period $TP_2$ (the time length $T_2$, time $t_1$ to time $t_2$), the object 140 is imaged on the basis of low-intensity light (specifically, in a state in which no light is being emitted from the light source 110 (see FIG. 3B), and the second image signal charge $q_2$ obtained at the light receiving portion 21 is stored into the second charge storage portion 24. At this stage, the first charge transfer control means 23 is in a non-operating state (an off-state), and the second charge transfer control means 25 is in an operating state (an on-state). Note that, in FIGS. 1A and 1B, electric charge (electrons, for example) is indicated by black dots.

After that, during the transfer period after the end of one imaging frame, for example, the first image signal charge $q_1$ stored in the first charge storage portion 22 and the second image signal charge $q_2$ stored in the second charge storage portion 24 are transferred to the control device 130, and the control device 130 obtains (generates) an image signal, on the basis of the difference between the first image signal charge $q_1$ stored in the first charge storage portion 22 and the second image signal charge $q_2$ stored in the second charge storage portion 24. Specifically, after the end of one imaging frame, for example, the control device 130 generates voltages $V_1$ and $V_2$ on the basis of the first image signal charge $q_1$ and the second image signal charge $q_2$, and generates an image signal from the difference between the voltage $V_1$ and the voltage $V_2$. That is, a process of subtracting the voltage $V_2$ from the voltage $V_1$ is performed.

Figure 9A:
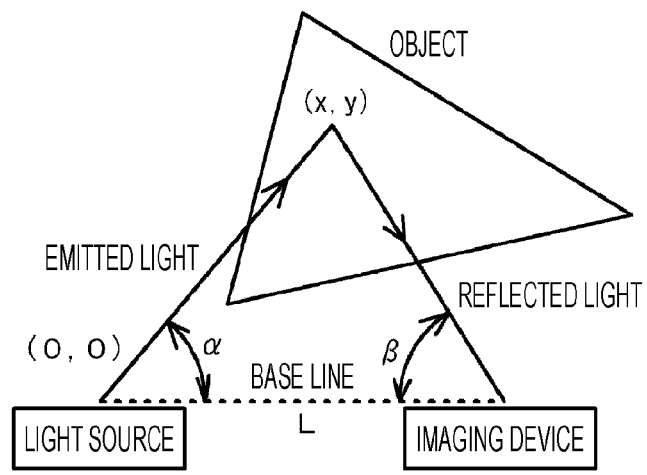
FIGS. 9A and 9B are conceptual diagrams showing the arrangement of an imaging device and the like for explaining a structured light method and an active stereo method, respectively.

Further, from the image signal obtained as above, the control device 130 calculates angles $\alpha$ and $\beta$ shown in FIG. 9A, further calculates the coordinates (x, y) on the basis of Equations (A), and calculates the z-coordinate. As a result of the above, the control device 130 can calculate the distance from the imaging device to the object 140, the two-dimensional and three-dimensional shapes of the object 140, motion of the object 140, and the like, on the basis of the structured light method, for example. Note that these processing algorithms can be well-known processing algorithms. The same applies to the various embodiments described later.

The operation and various processes to be performed by the imaging device 120 to obtain image signal charge, and the operation and various processes related to the transmission of the image signal charge to the control device 130 can be well-known operations and processes. The same applies to the various embodiments described later. The temporal order of obtaining the first image signal charge $q_1$ and the second image signal charge $q_2$ is any desired order. The temporal order of the first period $TP_1$ and the second period $TP_2$ may be reversed, and the second period $TP_2$ may be followed by the first period $TP_1$. Further, a period during which the imaging elements do not operate may be provided between the first period $TP_1$ and the second period $TP_2$.

In the example illustrated in FIG. 6A, the number of imaging frames per second is set to 15 (imaging frame rate: 15 fps), and one imaging frame period is divided into two periods (Period-1 and Period-2). Further, in the examples illustrated in FIGS. 6B and 6C, the number of imaging frames per second is set to 30 (imaging frame rate: 30 fps). In FIG. 6B, one imaging frame period is divided into two periods (Period-1 and Period-2). In FIG. 6C, one imaging frame period is divided into four periods (Period-1, Period-2, Period-3, and Period-4). The time lengths of the divided periods are the same. As the number of imaging frames per second becomes larger, and as the number of divided periods in one imaging frame period becomes larger, the shape of the parallelogram schematically showing one imaging frame changes. Specifically, the inclination angle of an oblique side extending from the upper left to the lower right becomes greater, as the number of imaging frames per second becomes larger, and as the number of divided periods in one imaging frame period becomes larger. That is, as the number of imaging frames per second becomes larger, and as the number of divided periods in one imaging frame period becomes larger, the exposure time in a case where a rolling shutter mechanism is adopted becomes longer. Further, as a result of the above, the time length that can be the duration of a high-intensity light illuminated state can be made longer.

If there is no time during which all the imaging elements can be illuminated with the reference light pattern of the same amount of light in one imaging frame, it is difficult to accurately remove the influence of ambient light. In the example illustrated in FIG. 6A, the time lengths of the imaging times $T_1$ and $T_2$ are about 10% of the time lengths of Period-1 and Period-2. Therefore, the number of imaging frames per second is preferably 15 (imaging frame rate: 15 fps) or larger, and the number of divided periods in one imaging frame is preferably two or larger. Further, as described above, as the number of imaging frames per second (imaging frame rate) becomes larger, and as the number of divided periods in one imaging frame period becomes larger, the time during which all the imaging elements can be illuminated with the reference light pattern of the same amount of light in one imaging frame can be made larger. Therefore, more preferably, the number of imaging frames per second is 30 or larger (imaging frame rate: 30 fps or higher), and the number of divided periods in one imaging frame is two or larger. Even more preferably, the number of imaging frames per second is 30 or larger (imaging frame rate: 30 fps or higher), and the number of divided periods in one imaging frame is three or larger. Note that, in the examples illustrated in FIGS. 6B and 6C, the time lengths of the imaging times $T_1$ and $T_2$ are about 50% and 70% of the time lengths of Period-1 and Period-2.

In the imaging device assembly of the first embodiment, or in the three-dimensional shape measuring device and the motion detecting device of the first embodiment including the imaging device assembly of the first embodiment, an image signal is generated from the difference between the first image signal charge and the second image signal charge. Thus, the influence of ambient light can be removed from the image signal. That is, the electric charge generated on the basis of ambient light is included in both the first image signal charge and the second image signal charge. Accordingly, it is possible to remove the influence of ambient light from the image signal by calculating the difference between the first image signal charge and the second image signal charge. Thus, the reference light pattern based on high-intensity light can be captured by the imaging device, without an increase in the luminance of the high-intensity light. Further, it is possible to solve the problem that the power consumption is increased at the light source, and the problem that the reference light pattern is visually recognized in some cases. Moreover, in an environment with a higher degree of freedom (use in doors or use not depending on the illuminance in the room, or use outdoors), it is possible to measure the distance from the imaging device to the object, the two-dimensional and three-dimensional shapes of the object, motion of the object, and the like. In a case where the object is located at a place far from the light source, or the object has a wide angle of view, the reference light pattern is darker, but the reference light pattern can still be captured by the imaging device without fail. Accordingly, the restrictions on distance can be relaxed. Further, the light intensity of the light source can be reduced, and thus, a high degree of safety can be ensured even in a case where the light source is formed with a semiconductor laser element, for example. The same applies to the embodiments described below. Note that, as the control device obtains an image signal on the basis of the difference between the first image signal charge stored in the first charge storage portion and the second image signal charge stored in the second charge storage portion, the control device does not need to include a frame memory, and the difference between the first image signal charge and the second image signal charge is not necessarily calculated on the basis of software. Thus, the configuration and structure of the control device can be simplified.

Second Embodiment

Figure 2B:
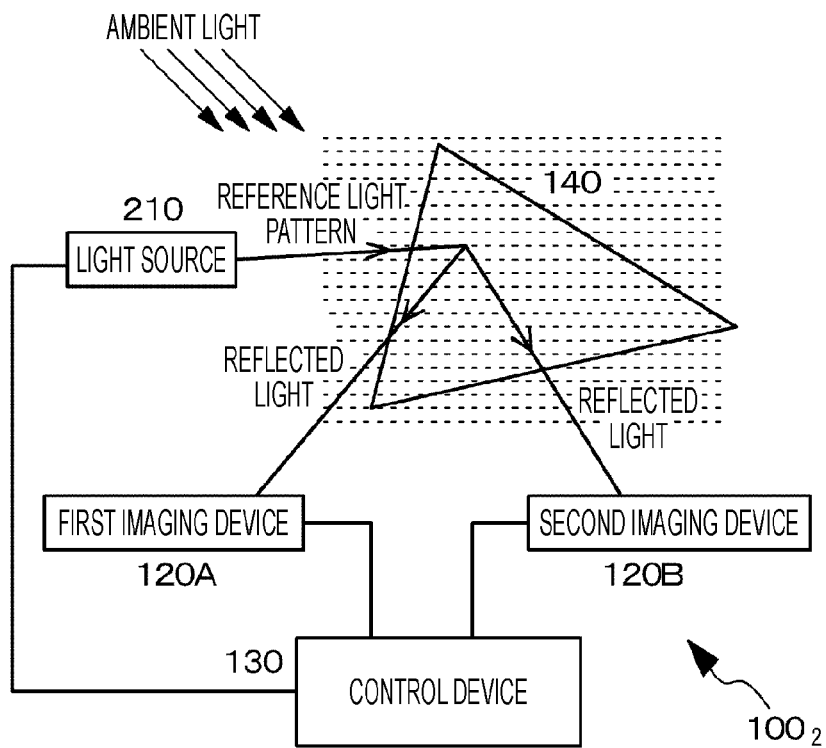
FIG. 2B is a conceptual diagram of the imaging device assembly of a second embodiment.

A second embodiment is a modification of the first embodiment. In an imaging device assembly $100_2$ of the second embodiment shown in a conceptual diagram in FIG. 2B, an imaging device is formed with active stereo imaging devices. Specifically, the imaging device is formed with a first imaging device 120A and a second imaging device 120B. That is, the light source 110 in the imaging device assembly of the first embodiment is replaced with the first imaging device 120A, and a light source 210 is provided separately. The shutter mechanism in the imaging devices 120A and 120B may be either a global shutter mechanism or a rolling shutter mechanism.

In the description below, an outline of an imaging method using the imaging device assembly of the second embodiment is described. Note that, in this imaging method, the distance from the imaging device to the object, the two-dimensional and three-dimensional shapes of the object, motion of the object, and the like are calculated on the basis of the active stereo method, for example. Here, under the control of the control device 130, the light source 110 emits a reference light pattern toward the object 140 in a high-intensity light illuminated state, and emits light in a low-intensity light illuminated state, as in the first embodiment. In a high-intensity light illuminated state, the light source 110 is in an operating state (which is a state in which the reference light pattern is being emitted). In a low-intensity light illuminated state, the light source 110 is in a non-operating state (which is a state in which the reference light pattern is not being emitted). In the second embodiment, $T_1=T_2$, and the number of imaging frames per second is set to 30 (imaging frame rate: 30 fps), as in the first embodiment.

Figure 4A:
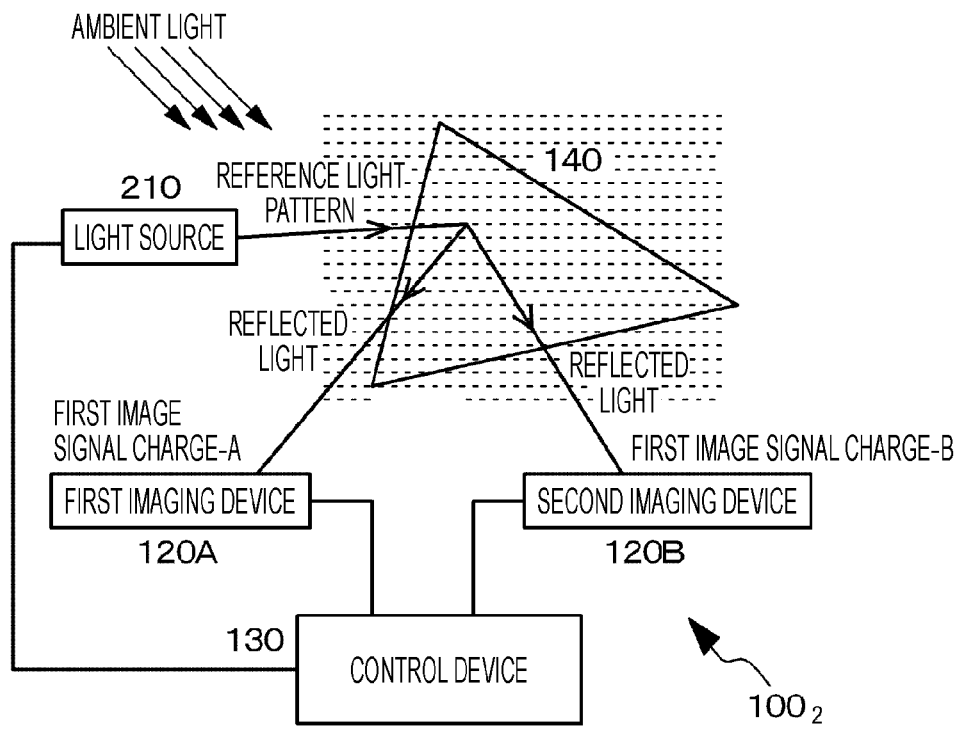
FIGS. 4A and 4B are diagrams schematically showing a state in which first image signal charge is acquired and a state in which second image signal charge is acquired in an imaging device assembly of the second embodiment, respectively.
Figure 4B:
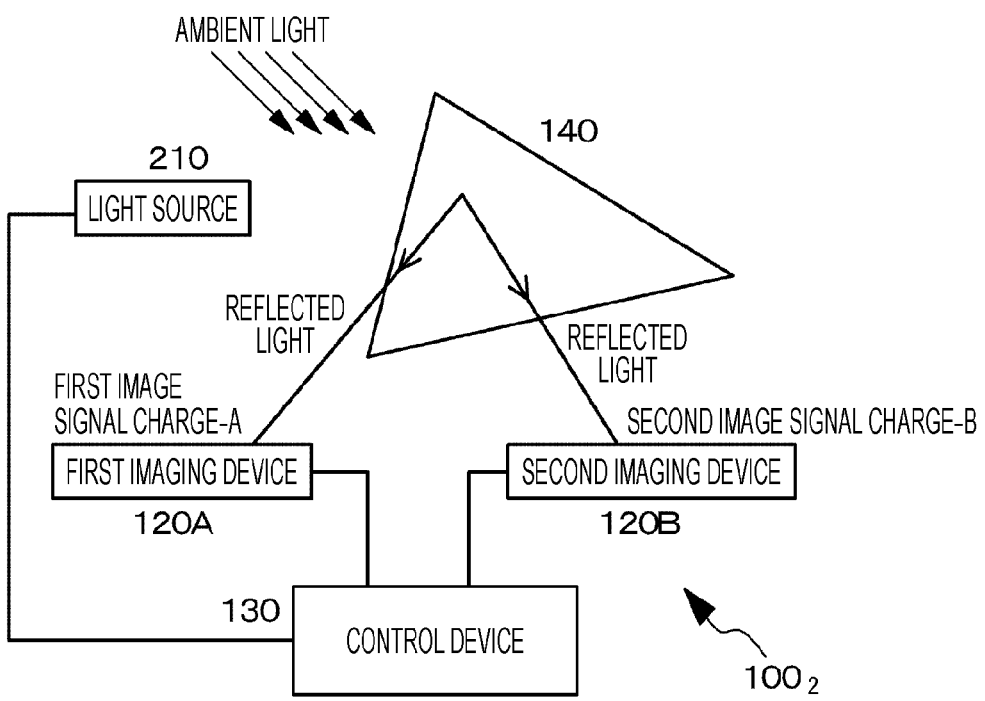

Each of the imaging devices 120A and 120B captures an image of the reference light pattern and the object 140 in a high-intensity light illuminated state, to obtain first image signal charge (see FIG. 4A). Each of the imaging devices 120A and 120B captures an image of at least the object 140 in a low-intensity light illuminated state (or captures an image of the object 140 in a low-intensity light illuminated state in the second embodiment), to obtain second image signal charge (see FIG. 4B). The first image signal charge obtained from the first imaging device 120A is called "the first image signal charge-A", and the first image signal charge obtained from the second imaging device 120B is called "the first image signal charge-B". The second image signal charge obtained from the first imaging device 120A is called "the second image signal charge-A", and the second image signal charge obtained from the second imaging device 120B is called "the second image signal charge-B".

Further, after the end of one imaging frame, the control device 130 generates image signals from the difference between the first image signal charge-A and the second image signal charge-A, and the difference between the first image signal charge-B and the second image signal charge-B (the image signals are an image signal-A obtained from the first imaging device 120A, and an image signal-B obtained from the second imaging device 120B), for example. That is, the control device 130 performs a subtraction process between the first image signal charge-A and the first image signal charge-B, and the second image signal charge-A and the second image signal charge-B, which have been obtained.

Figure 9B:
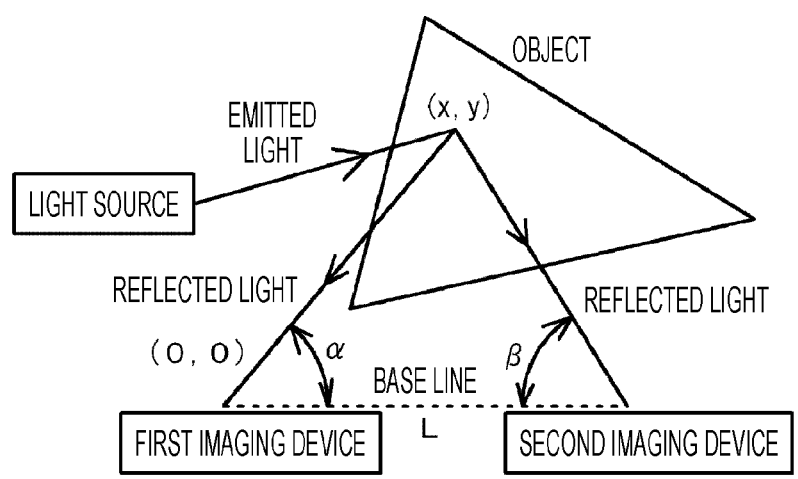

From the image signal-A and the image signal-B obtained as above, the control device 130 calculates angles α and β shown in FIG. 9B, further calculates the coordinates (x, y) on the basis of Equations (A), and calculates the z-coordinate. As a result of the above, the control device 130 can calculate the distance from the imaging devices to the object, the two-dimensional and three-dimensional shapes of the object, motion of the object, and the like, on the basis of the active stereo method, for example. Note that these processing algorithms can be well-known processing algorithms. The same applies to the various embodiments described later.

In the second embodiment, the second image signal charge-A and the second image signal charge-B are the image signal charge obtained in the absence of the reference light pattern, and the first image signal charge-A and the first image signal charge-B are the image signal charge obtained in the presence of the reference light pattern. Accordingly, it is possible to obtain the image signal-A and the image signal-B by calculating the difference between the first image signal charge-A and the second image signal charge-A, and the difference between the first image signal charge-B and the second image signal charge-B. Ambient light is included in any of the first image signal charge-A, the first image signal charge-B, the second image signal charge-A, and the second image signal charge-B. Accordingly, it is possible to remove the influence of ambient light from the image signal by calculating the difference between the first image signal charge and the second image signal charge.

Third Embodiment

A third embodiment is modifications of the first and second embodiments. In the first and second embodiments, $T_1=T_2$. In the third embodiment, on the other hand, $T_1>T_2$. As for the shutter mechanism, either a global shutter mechanism or a rolling shutter mechanism can be used. FIGS. 7A, 7B, 8A, and 8B schematically show the imaging times $T_1$ and $T_2$ per imaging frame in a case where a rolling shutter mechanism is used as the shutter mechanism. In the examples illustrated in FIGS. 7A, 7B, 8A, and 8B, the number of imaging frames per second is set to 30 (imaging frame rate: 30 fps), and one imaging frame is divided into two or more periods, or specifically, is equally divided into four periods.

Figure 7A:
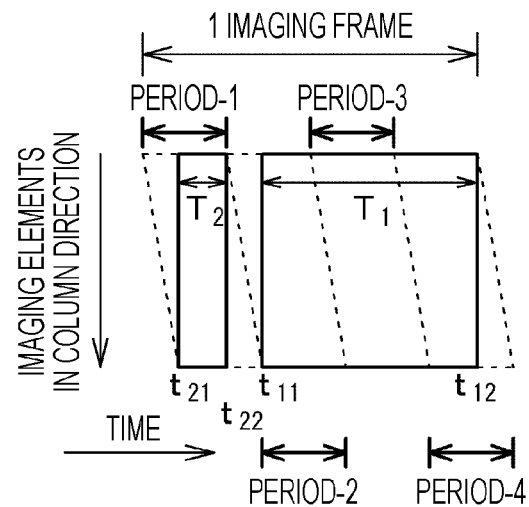
FIGS. 7A and 7B are diagrams schematically showing imaging times $T_1$ and $T_2$ per imaging frame.

In the example illustrated in FIG. 7A, the value of $T_1/T_2$ is greater than 3, a portion of Period-1 is in a low-intensity light illuminated state, and a portion of Period-2, all of Period-3, and a portion of Period-4 are in a high-intensity light illuminated state. In the example illustrated in FIG. 7B, the value of $T_1/T_2$ is 3, a portion of Period-1 is in a low-intensity light illuminated state, and a portion of Period-2, a portion of Period-3, and a portion of Period-4 are in a high-intensity light illuminated state. In the example illustrated in FIG. 8A, the value of $T_1/T_2$ is 1, all of Period-2 is in a high-intensity light illuminated state, and all of Period-4 is in a low-intensity light illuminated state. In the example illustrated in FIG. 8B, the value of $T_1/T_2$ is greater than 1, a portion of Period-1, all of Period-2, a portion of Period-3, and all of Period-4 are in a high-intensity light illuminated state, and the rest of Period-1 and the rest of Period-3 are in a low-intensity light illuminated state. Note that, on the basis of an instruction from the user of the imaging device assembly, the imaging times $T_1$ and $T_2$ can be made variable, or the ratio of $T_1/T_2$ can be made variable.

Figure 7B:
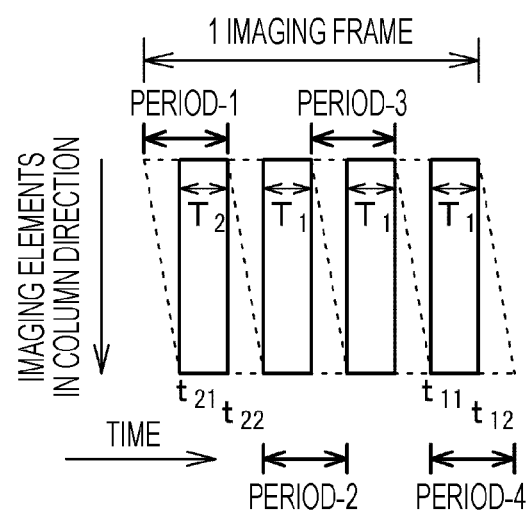
Figure 8A:
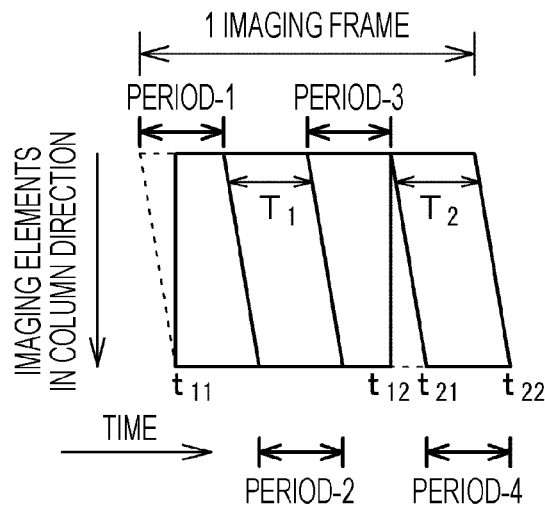
FIGS. 8A and 8B are diagrams schematically showing imaging times $T_1$ and $T_2$ per imaging frame.

In the examples illustrated in FIGS. 7A, 7B, and 8A, one imaging frame is divided into a plurality of periods. One of the periods is in a low-intensity light illuminated state, and the remaining periods are in a high-intensity light illuminated state. Alternatively, in the examples illustrated in FIGS. 7A, 7B, 8A, and 8B, or especially, in the example illustrated in 8B, an imaging period during which the reference light pattern and the object are imaged in a high-intensity light illuminated state, and an imaging period during which at least the object is imaged in a low-intensity light illuminated state are repeated, and the former imaging period is longer than the latter imaging period.

For example, in the example illustrated in FIG. 7A, an image signal can be obtained from the difference between the first image signal charge obtained during the imaging time $T_1$ from time $t_{11}$ to time $t_{12}$, and the second image signal charge obtained during the imaging time $T_2$ from time $t_{21}$ to time $t_{22}$. However, to obtain an image signal, it is necessary to perform the correction shown below. The same applies to the example illustrated in FIG. 7B.

(first image signal charge)−{2+(time length of Period-3)/(time length of $T_2$)}×(second image signal charge)

In the example illustrated in FIG. 7B, the influence of ambient light is only required to be removed from the image signal, on the basis of the difference between the second image signal charge obtained during Period-1 and the total image signal charge obtained during Period-2, Period-3, and Period-4, for example.

In the example illustrated in FIG. 8A, the influence of ambient light is only required to be removed from the image signal, on the basis of the difference between the second image signal charge obtained during Period-1, and the image signal charge obtained during Period-3 and the image signal charge obtained during Period-1.

Figure 8B:
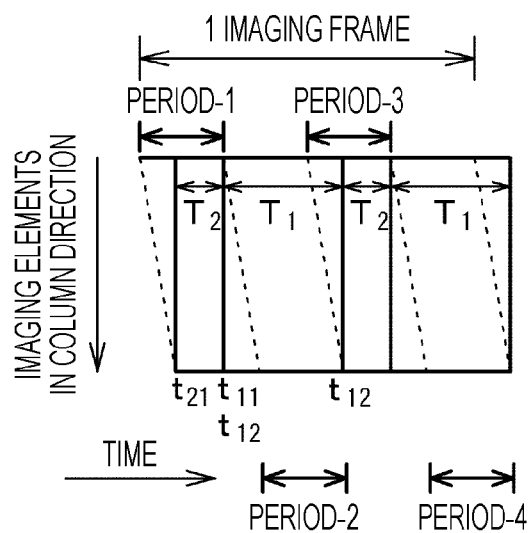

In the example illustrated in FIG. 8B, the second image signal charge obtained during Period-1 is stored in the second charge storage portion, and the influence of ambient light is only required to be removed from the image signal on the basis of the difference between the first image signal charge that has been obtained during a portion of Period-1, all of Period-2, and a portion of Period-3, and been stored into the first charge storage portion, and the second image signal charge.

Note that, in a case where it is difficult to obtain an image signal, the value of $T_1/T_2$ is preferably made greater. Further, in a case where ambient light is scarce, the value of $T_1/T_2$ is preferably changed to achieve optimization. For example, in a case where there is almost no ambient light, the value of $T_1/T_2$ may be a very great value, or $T_1/T_2$ may be ∞.

Further, in the third embodiment, the signal amount based on the first image signal charge is $T_1/T_2$ times the signal amount based on the second image signal charge in some cases. Therefore, when the difference between the first image signal charge and the second image signal charge is calculated, the signal amount based on the second image signal charge is only required to be multiplied by $T_1/T_2$, or the signal amount based on the first image signal charge is only required to be multiplied by $T_2/T_1$.

Except for the above aspects, the imaging device assembly or the imaging method of the third embodiment can be similar to the imaging device assemblies or the imaging methods of the first and second embodiments, and therefore, detailed explanation thereof is not made herein.

Fourth Embodiment

Figure 5:
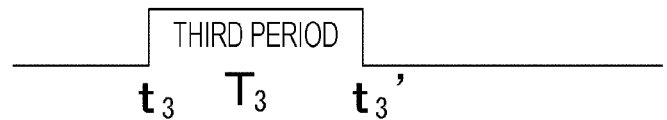
FIG. 5 is a chart for explaining a temporal operation in a second operation mode of an imaging element in an imaging device assembly of a fourth embodiment.
Figure 5:
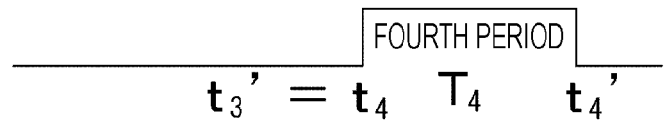
Figure 5:
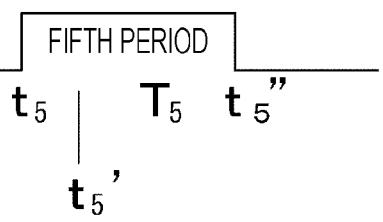

A fourth embodiment is modifications of the first to third embodiments. In the fourth embodiment, each imaging element is further operated in a second operation mode. That is, an imaging device assembly of the fourth embodiment is an imaging device assembly of the present disclosure having the second operation mode. FIG. 5 shows a temporal operation in the second operation mode of an imaging element in the imaging device assembly of the fourth embodiment.

Specifically, in the second operation mode, under the control of the control device 130, an imaging element captures an image of the object on the basis of light emitted from the light source 110 during a fifth period $TP_5$ (time length $T_5$) that overlaps a third period $TP_3$ (time length $T_3$) and a fourth period $TP_4$ (time length $T_4$). During the third period $TP_3$, third image signal charge obtained at the light receiving portion 21 is stored into the first charge storage portion 22. During the fourth period $TP_4$, fourth image signal charge obtained at the light receiving portion 21 is stored into the second charge storage portion 24.

The control device 130 calculates the distance from the imaging device 120 to the object, on the basis of the third image signal charge stored in the first charge storage portion 22 and the fourth image signal charge stored in the second charge storage portion 24. Further, in this case, the distance D from the imaging device 120 to the object is calculated on the basis of the following equation:

$$D = (c \cdot T_P/2) \times Q_4/(Q_3+Q_4)$$

where $Q_3$ represents the third image signal charge, $Q_4$ represents the fourth image signal charge, c represents the speed of light, and $T_P$ represents the time of the third period $TP_3$ and the fourth period $TP_4$. That is, in the fourth embodiment, the distance to the object is calculated on the basis of an indirect TOF method.

Here, the third period is followed by the fourth period, and the relationship $T_3+T_4 > T_5$ is established. Specifically, $T_3=T_4=T_5$.

In the imaging device assembly of the fourth embodiment, the control device 130 performs switching from the first operation mode to the second operation mode, and switching from the second operation mode to the first operation mode. That is, on the basis of the various kinds of image signal charge from the imaging device 120, the control device 130 performs switching from the first operation mode to the second operation mode, and switching from the second operation mode to the first operation mode. Also, on the basis of an instruction from the user, the control device 130 performs switching from the first operation mode to the second operation mode, and switching from the second operation mode to the first operation mode. Alternatively, on the basis of the various kinds of image signal charge from the imaging device 120 in addition to an instruction from the user, the control device 130 performs switching from the first operation mode to the second operation mode, and switching from the second operation mode to the first operation mode.

In general, distance measurement based on the first operation mode is suitable for measurement of a short distance (shorter than 1 m, for example), and distance measurement based on the second operation mode is suitable for measurement of a long distance (1 m or longer, for example). Therefore, in the imaging device assembly of the fourth embodiment, if the distance as a measurement result is smaller than a predetermined value (1 m, for example) when the distance to the object calculated on the basis of the second operation mode is smaller than the predetermined value, or when the distance to the object calculated on the basis of the second operation mode is measured, the control device 130 switches from the second operation mode to the first operation mode, and calculates the distance to the object. Also, if the distance as a measurement result is equal to or longer than the predetermined value (1 m, for example) when the distance to the object obtained on the basis of the first operation mode is measured, the control device 130 switches from the first operation mode to the second operation mode, and calculates the distance to the object.

Figure 10:
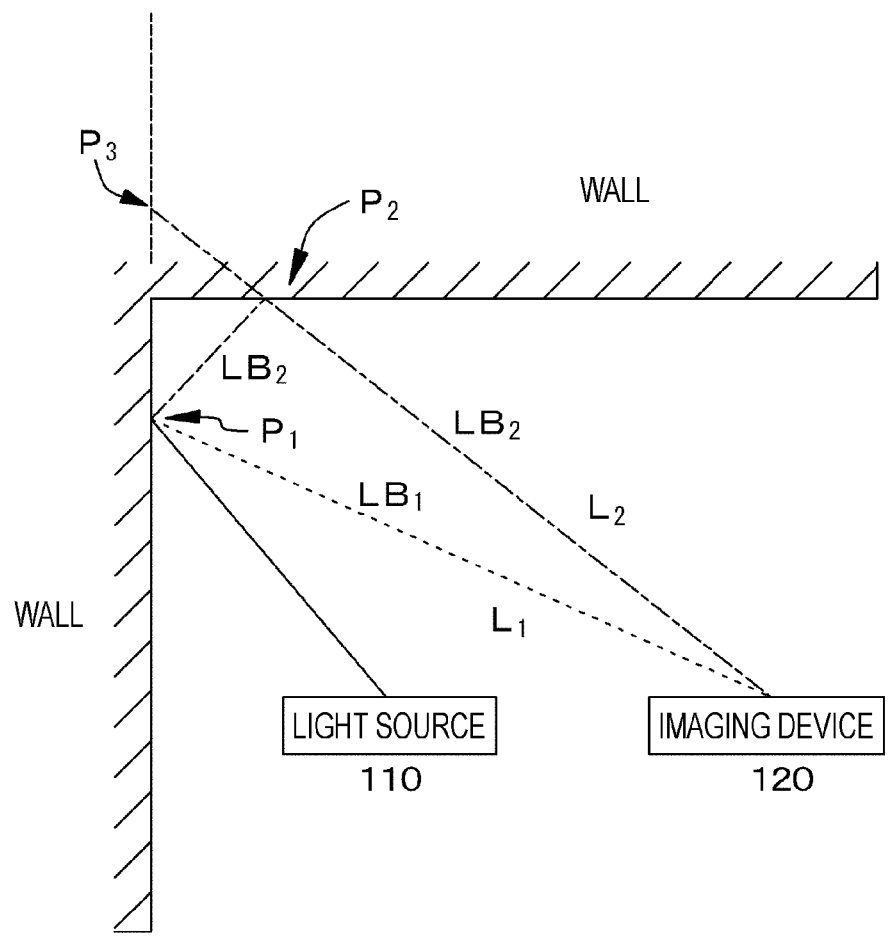
FIG. 10 is a diagram for schematically explaining a state in which a plurality of rays of reflected lights is generated as a result of reflection of light by a wall, and discontinuity or abnormality is caused in the value of a measured distance.

As described above, in the second operation mode, the time since light comes into contact with the object till the light enters the imaging device is replaced with the exposure amount of the imaging device and is then measured. However, in a case where the object is at a corner of a room, for example, as a result of light reflection by a wall, a discontinuous state appears in the distance to the object calculated on the basis of the second operation mode, as schematically shown in FIG. 10. Alternatively, the distance to the object calculated on the basis of the second operation mode has an inconstant value.

Specifically, there is a light beam $LB_1$ that is reflected at a certain point $P_1$ on a wall and directly enters the imaging device 120, but there also is a light beam $LB_2$ that is reflected at the certain point $P_1$ on the wall, travels to a point $P_2$, is reflected at the point $P_2$, and then enters the imaging device 120, for example. In this case, the distance from the point $P_1$ to the imaging device 120 based on the light beam $LB_1$ is $L_1$, but, in practice, the distance from the point $P_1$ to the imaging device 120 based on the light beam $LB_2$ is the distance $L_2$ from a virtual point $P_3$ to the imaging device 120. Therefore, the distance from a point near the point $P_1$ to the imaging device 120 has a value close to $L_1$, in a case where the reflected light at the point near the point $P_1$ directly enters the imaging device 120. On the other hand, when the light beam $LB_2$ is generated at the point $P_1$, the distance from the point $P_1$ to the imaging device 120 becomes $L_2$, and a discontinuous state appears in the distance to the object calculated on the basis of the second operation mode. Alternatively, the distance to the object calculated on the basis of the second operation mode becomes an inconstant value.

In such a case, the control device 130 switches to the first operation mode, and calculates the distance to the object. In the first operation mode, the distance is calculated on the basis of the shape of the object, and accordingly, any inconvenience is not caused in the distance measurement based on the second operation mode.

Alternatively, in the imaging device, the external shape of the object is first calculated in the first operation mode, for example. In a case where part of the object is a corner of a room, for example, the control device 130 enables the first operation mode in a desired region (specifically, the region showing the corner of the room) of the imaging device 120, and enables the second operation mode in another desired region (specifically, a region other than the region showing the corner of the room) of the imaging device 120. Alternatively, in the imaging device, the distance to the object is first calculated in the second operation mode, for example. In a case where part of the object is a corner of a room, for example, a discontinuous state might appear in the distance to the object, or the distance to the object might be an inconstant value. In that case, the control device 130 enables the first operation mode in a desired region (specifically, the region showing the corner of the room) of the imaging device 120, and enables the second operation mode in another desired region (specifically, a region other than the region showing the corner of the room) of the imaging device 120.

Further, in the imaging device assembly of the fourth embodiment, the control device 130 can be designed to calibrate the distance to the object calculated on the basis of the second operation mode, on the basis of the distance to the object calculated on the basis of the first operation mode. Specifically, there are cases where an error occurs in a distance measurement result obtained on the basis of the second operation mode, due to a change in the temperature of the imaging elements. Even if a change is caused in the temperature of the imaging elements, no errors will occur in a distance measurement result obtained on the basis of the first operation mode. Therefore, the distance to the object located at a certain distance (1 m, for example) is calculated on the basis of the first operation mode and the second operation mode, and the distance measurement in the second operation mode should be calibrated on the basis of the distance obtained in the first operation mode. In the first operation mode, on the other hand, there are cases where, when a change is caused in the distance (the length of the base line) L between the light source and the imaging device, or in the distance between two imaging devices, an error occurs in a distance measurement result obtained on the basis of the first operation mode. Even if such a change is caused, no errors will occur in a distance measurement result obtained on the basis of the second operation mode. Therefore, the distance to the object located at a certain distance (1 m, for example) is calculated on the basis of the first operation mode and the second operation mode, and the distance measurement in the first operation mode should be calibrated on the basis of the distance obtained in the second operation mode. For example, it is only required to determine whether to perform calibration in the first operation mode, or whether to perform calibration in the second operation mode, on the basis of an instruction from the user of the imaging device assembly.

Further, in the imaging device assembly of the fourth embodiment, the control device 130 creates a first depth map on the basis of the first operation mode by a known method, creates a second depth map on the basis of the second operation mode by a known method, and combines the first depth map and the second depth map. By doing so, the control device 130 can increase the depth map (depth information) accuracy.

Although the present disclosure has been described so far on the basis of preferred embodiments, the present disclosure is not limited to these embodiments. The configurations of the imaging device assemblies, the imaging devices, the light sources, and the control devices, and the configurations of the structures described in the embodiments are merely examples, and can be modified as appropriate. Further, in the embodiments, various values have been mentioned, but these are also examples. If there are changes to the specifications of the light source, the imaging device, and the control device to be used, for example, those values also change naturally. Needless to say, the imaging device assemblies described in the second to fourth embodiments can be applied to three-dimensional shape measuring devices and motion detecting devices.

Note that the present disclosure may also be embodied in the configurations described below.

[A01]<<Imaging device assembly>>
An imaging device assembly including:
a light source that illuminates an object;
an imaging device; and
a control device that controls the light source and the imaging device,
in which
the imaging device includes a plurality of imaging elements,
each imaging element includes:
a light receiving portion;
a first charge storage portion and a second charge storage portion; and
a first charge transfer control means that controls, under control of the control device, transfer of electric charge stored in the light receiving portion to the first charge storage portion, and a second charge transfer control means that controls, under control of the control device, transfer of electric charge stored in the light receiving portion to the second charge storage portion,
the imaging device assembly is operated in a first operation mode,
in the first operation mode,
during a first period, the imaging element under control of the control device captures an image of the object on the basis of high-intensity light emitted from the light source and stores first image signal charge obtained at the light receiving portion into the first charge storage portion, and,
during a second period, the imaging element under control of the control device captures an image of the object on the basis of low-intensity light and stores second image signal charge obtained at the light receiving portion into the second charge storage portion, and
the control device obtains an image signal, on the basis of a difference between the first image signal charge stored in the first charge storage portion and the second image signal charge stored in the second charge storage portion.

[A02] The imaging device assembly according to [A01], in which
the high-intensity light emitted from the light source is a reference light pattern, and,
on the basis of the obtained image signal, the control device calculates a distance to the object, an external shape of the object, or the distance to the object and the external shape of the object.

[A03] The imaging device assembly according to [A02], in which, from the obtained image signal, the control device calculates the distance to the object, the external shape of the object, or the distance to the object and the external shape of the object, on the basis of triangulation.

[A04] The imaging device assembly according to any one of [A01] to [A03], which is further operated in a second operation mode, in which,
in the second operation mode,
under control of the control device, the imaging element captures an image of the object on the basis of light emitted from the light source during a fifth period overlapping a third period and a fourth period, stores third image signal charge obtained at the light receiving portion into the first charge storage portion during the third period, and stores fourth image signal charge obtained at the light receiving portion into the second charge storage portion during the fourth period, and the control device calculates a distance from the imaging device to the object, on the basis of the third image signal charge stored in the first charge storage portion and the fourth image signal charge stored in the second charge storage portion.

[A05] The imaging device assembly according to [A04], in which
the distance D from the imaging device to the object is calculated on the basis of:

$$D=(c \cdot T_P/2) \times Q_4/(Q_3+Q_4)$$

where $Q_3$ represents the third image signal charge, $Q_4$ represents the fourth image signal charge, c represents the speed of light, and $T_P$ represents a time of the third period and the fourth period.

[A06] The imaging device assembly according to [A04] or [A05], in which the control device performs switching from the first operation mode to the second operation mode, and switching from the second operation mode to the first operation mode.

[A07] The imaging device assembly according to any one of [A04] to [A06], in which the control device creates a first depth map on the basis of the first operation mode, creates a second depth map on the basis of the second operation mode, and combines the first depth map and the second depth map.

[A08] The imaging device assembly according to any one of [A04] to [A07], in which the control device enables the first operation mode in a desired region of the imaging device, and enables the second operation mode in another desired region of the imaging device.

[A09] The imaging device assembly according to any one of [A04] to [A08], in which, on the basis of the distance to the object obtained on the basis of the first operation mode, the control device calibrates the distance to the object obtained on the basis of the second operation mode.

[A10] The imaging device assembly according to any one of [A04] to [A08], in which, on the basis of the distance to the object obtained on the basis of the second operation mode, the control device calibrates the distance to the object obtained on the basis of the first operation mode.

[A11] The imaging device assembly according to any one of [A04] to [A10], in which, when a discontinuous state is found in the distance to the object obtained on the basis of the second operation mode, the control device switches to the first operation mode, and calculates the distance to the object.

[A12] The imaging device assembly according to any one of [A04] to [A11], in which, when the distance to the object obtained on the basis of the second operation mode is shorter than a predetermined value, the control device switches to the first operation mode, and calculates the distance to the object.

[A13] The imaging device assembly according to any one of [A04] to [A11], in which, when the distance to the object obtained on the basis of the first operation mode is equal to or longer than a predetermined value, the control device switches to the second operation mode, and calculates the distance to the object.

[A14] The imaging device assembly according to any one of [A01] to [A13], which includes one imaging device.

[A15] The imaging device assembly according to [A14], in which, from the obtained image signal, the control device calculates the distance from the imaging device to the object on the basis of a structured light method.

[A16] The imaging device assembly according to any one of [A01] to [A13], in which the imaging device includes an active stereo imaging device. [A17] The imaging device assembly according to [A16], in which, from the obtained image signal, the control device calculates the distance from the imaging device to the object on the basis of an active stereo method.

[A18] The imaging device assembly according to any one of [A01] to [A17], in which the light source emits infrared rays.

[A19] The imaging device assembly according to any one of [A01] to [A18], in which the light source is in an operating state in a high-intensity light illuminated state, and the light source is in a non-operating state in a low-intensity light illuminated state.

[A20] The imaging device assembly according to any one of [A01] to [A19], in which the light source includes a semiconductor light-emitting element.

[A21] The imaging device assembly according to any one of [A01] to [A20], which satisfies $$T_1 > T_2$$

where $T_1$ represents an imaging time during which the reference light pattern and the object are imaged in a high-intensity light illuminated state, and $T_2$ represents an imaging time during which at least the object is imaged in a low-intensity light illuminated state.

[A22] The imaging device assembly according to [A21], in which the imaging times $T_1$ and $T_2$ are variable, or a ratio of $T_1/T_2$ is variable, on the basis of an instruction from a user of the imaging device assembly.

[A23] The imaging device assembly according to any one of [A01] to [A20], in which
one imaging frame is divided into a plurality of periods,
one of the periods is in a low-intensity light illuminated state, and
the remaining periods are in a high-intensity light illuminated state.

[A24] The imaging device assembly according to [A23], in which
the imaging frame rate is 30 frames/sec, and
one imaging frame is divided into two or more periods.

[A25] The imaging device assembly according to any one of [A01] to [A20], in which an imaging period during which the reference light pattern and the object are imaged in a high-intensity light illuminated state, and an imaging period during which at least the object is imaged in a low-intensity light illuminated state are repeated, and the former imaging period is longer than the latter imaging period.

[A26] The imaging device assembly according to any one of [A01] to [A25], in which
the imaging device includes imaging elements arranged in a two-dimensional matrix in a first direction and a second direction,
the imaging device has a rolling shutter mechanism, and
the control device controls the light source and the imaging device, to cause all the imaging elements to capture an image of the reference light pattern and the object in a high-intensity light illuminated state and output a first image signal to the control device, and cause all the imaging elements to capture an image of at least the object in a low-intensity light illuminated state and output a second image signal to the control device.

[B01]<<Three-dimensional shape measuring device>>
A three-dimensional shape measuring device including the imaging device assembly according to any one of [A01] to [A26].

[B02] The three-dimensional shape measuring device according to [B01], further including an arithmetic device, in which the arithmetic device calculates a three-dimensional shape of the object from the image signal.

[C01]<<Motion detecting device>>

A motion detecting device including the imaging device assembly according to any one of [A01] to [A26].

[C02] The motion detecting device according to [C01], further including an arithmetic device, in which the arithmetic device calculates a three-dimensional shape of the object from the image signal, extracts a feature point of the object from the calculated three-dimensional shape, calculates a position of the feature point of the object, and detects motion of the object from a change in the calculated position of the feature point.

REFERENCE SIGNS LIST $100_1$, $100_2$ Imaging device assembly
110, 210 Light source
120, 120A, 120B Imaging device
130 Control device
140 Object
10 Imaging element
21 Light receiving portion
22 First charge storage portion
24 Second charge storage portion
23 First charge transfer control means
25 Second charge transfer control means
26 Light blocking layer

The invention claimed is:

1. An imaging device assembly comprising:
a light source that illuminates an object;
an imaging device; and
a control device that controls the light source and the imaging device,
wherein
the imaging device includes a plurality of imaging elements,
each imaging element includes:
a light receiving portion;
a first charge storage portion and a second charge storage portion; and
a first charge transfer control means that controls, under control of the control device, transfer of electric charge stored in the light receiving portion to the first charge storage portion, and a second charge transfer control means that controls, under control of the control device, transfer of electric charge stored in the light receiving portion to the second charge storage portion,
the imaging device assembly is operated in a first operation mode,
in the first operation mode,
during a first period, the imaging element under control of the control device captures an image of the object on a basis of high-intensity light emitted from the light source and stores first image signal charge obtained at the light receiving portion into the first charge storage portion, and,
during a second period, the imaging element under control of the control device captures an image of the object on a basis of low-intensity light and stores second image signal charge obtained at the light receiving portion into the second charge storage portion, and
the control device obtains an image signal, on a basis of a difference between the first image signal charge stored in the first charge storage portion and the second image signal charge stored in the second charge storage portion.

2. The imaging device assembly according to claim 1, wherein
the high-intensity light emitted from the light source is a reference light pattern, and,
on a basis of the obtained image signal, the control device calculates a distance to the object, an external shape of the object, or the distance to the object and the external shape of the object.

3. The imaging device assembly according to claim 2, wherein, from the obtained image signal, the control device calculates the distance to the object, the external shape of the object, or the distance to the object and the external shape of the object, on a basis of triangulation.

4. The imaging device assembly according to claim 1, which is further operated in a second operation mode, wherein,
in the second operation mode,
under control of the control device, the imaging element captures an image of the object on a basis of light emitted from the light source during a fifth period overlapping a third period and a fourth period, stores third image signal charge obtained at the light receiving portion into the first charge storage portion during the third period, and stores fourth image signal charge obtained at the light receiving portion into the second charge storage portion during the fourth period, and
the control device calculates a distance from the imaging device to the object, on a basis of the third image signal charge stored in the first charge storage portion and the fourth image signal charge stored in the second charge storage portion.

5. The imaging device assembly according to claim 4, wherein the distance D from the imaging device to the object is calculated on a basis of:

$$D=(c \cdot T_P/2) \times Q_4/(Q_3+Q_4)$$

where $Q_3$ represents the third image signal charge, $Q_4$ represents the fourth image signal charge, c represents the speed of light, and $T_P$ represents a time of the third period and the fourth period.

6. The imaging device assembly according to claim 4, wherein the control device performs switching from the first operation mode to the second operation mode, and switching from the second operation mode to the first operation mode.

7. The imaging device assembly according to claim 4, wherein the control device creates a first depth map on a basis of the first operation mode, creates a second depth map on a basis of the second operation mode, and combines the first depth map and the second depth map.

8. The imaging device assembly according to claim 4, wherein the control device enables the first operation mode in a desired region of the imaging device, and enables the second operation mode in another desired region of the imaging device.

9. The imaging device assembly according to claim 4, wherein, on a basis of the distance to the object obtained on a basis of the first operation mode, the control device calibrates the distance to the object obtained on a basis of the second operation mode.

10. The imaging device assembly according to claim 4, wherein, on a basis of the distance to the object obtained on a basis of the second operation mode, the control device calibrates the distance to the object obtained on a basis of the first operation mode.

11. The imaging device assembly according to claim 4, wherein, when a discontinuous state is found in the distance to the object obtained on a basis of the second operation mode, the control device switches to the first operation mode, and calculates the distance to the object.

12. The imaging device assembly according to claim 4, wherein, when the distance to the object obtained on a basis of the second operation mode is shorter than a predetermined value, the control device switches to the first operation mode, and calculates the distance to the object.

13. The imaging device assembly according to claim 4, wherein, when the distance to the object obtained on a basis of the first operation mode is equal to or longer than a predetermined value, the control device switches to the second operation mode, and calculates the distance to the object.

14. The imaging device assembly according to claim 1, comprising one imaging device, the one imaging device being the imaging device.

15. The imaging device assembly according to claim 1, wherein the imaging device includes an active stereo imaging device.

16. A three-dimensional shape measuring device comprising the imaging device assembly according to claim 1.

17. The three-dimensional shape measuring device according to claim 16, further comprising an arithmetic device, wherein the arithmetic device calculates a three-dimensional shape of the object from the image signal.

18. A motion detecting device comprising the imaging device assembly according to claim 1.

19. The motion detecting device according to claim 18, further comprising an arithmetic device, wherein the arithmetic device calculates a three-dimensional shape of the object from the image signal, extracts a feature point of the object from the calculated three-dimensional shape, calculates a position of the feature point of the object, and detects motion of the object from a change in the calculated position of the feature point.

* * * * *